(12) United States Patent
Madocks

(10) Patent No.: US 7,932,678 B2
(45) Date of Patent: *Apr. 26, 2011

(54) MAGNETIC MIRROR PLASMA SOURCE AND METHOD USING SAME

(75) Inventor: John Madocks, Tucson, AZ (US)

(73) Assignee: General Plasma, Inc., Tucson, AZ (US)

(*) Notice: Subject to any disclaimer, the term of this patent is extended or adjusted under 35 U.S.C. 154(b) by 1218 days.

This patent is subject to a terminal disclaimer.

(21) Appl. No.: 10/571,214

(22) PCT Filed: Sep. 13, 2004

(86) PCT No.: PCT/US2004/029744
§ 371 (c)(1),
(2), (4) Date: Mar. 9, 2006

(87) PCT Pub. No.: WO2005/028697
PCT Pub. Date: Mar. 31, 2005

(65) Prior Publication Data
US 2007/0026161 A1    Feb. 1, 2007

(51) Int. Cl.
| | |
|---|---|
| C23C 16/00 | (2006.01) |
| C23C 14/00 | (2006.01) |
| H01J 7/24 | (2006.01) |
| H05B 31/26 | (2006.01) |
| C25B 9/00 | (2006.01) |
| C25B 11/00 | (2006.01) |
| C25B 13/00 | (2006.01) |

(52) U.S. Cl. .......... 315/111.21; 118/723 R; 118/723 FI; 204/298.14; 204/298.16; 315/111.71

(58) Field of Classification Search ............. 204/298.11, 204/298.14, 298.16; 156/345.37, 345.49; 315/111.41, 111.21, 111.71; 118/723 R, 723 FI See application file for complete search history.

(56) References Cited

U.S. PATENT DOCUMENTS

| | | | |
|---|---|---|---|
| 2,146,025 | A | 2/1939 | Penning |
| 3,282,815 | A | 11/1966 | Kat et al. |
| 4,356,073 | A | 10/1982 | McKelvey |
| 4,407,894 | A | 10/1983 | Kadokura et al. |
| 4,445,997 | A | 5/1984 | McKelvey |
| 4,624,767 | A | 11/1986 | Obinata |

(Continued)

FOREIGN PATENT DOCUMENTS

JP        09241406 A  *  9/1997

OTHER PUBLICATIONS

Roth, "Industrial Plasma Engineering, vol. 1: Principles, reference section 3.4.2", IOP Publishing, Ltd. 1995, pp. 75-79.

(Continued)

*Primary Examiner* — Alexa D Neckel
*Assistant Examiner* — Michael Band
(74) *Attorney, Agent, or Firm* — Avery N. Goldstein; Patent Procurement Services

(57) ABSTRACT

A magnetic mirror plasma source includes a gap separating a substrate from a cathode. A mirror magnetic field extends between the substrate and the cathode through the gap. The magnetic field lines at a proximal surface of the substrate are at least two times as strong as those field lines entering the cathode. An anode is disposed such that a closed loop electron Hall current containment region is formed within the magnetic field.

23 Claims, 10 Drawing Sheets

U.S. PATENT DOCUMENTS

| | | | |
|---|---|---|---|
| 4,631,106 A | 12/1986 | Nakazato et al. | |
| 4,761,219 A | 8/1988 | Sasaki et al. | |
| 4,767,516 A | 8/1988 | Nakatsuka et al. | |
| 4,784,739 A | 11/1988 | Kadokura et al. | |
| 4,842,683 A * | 6/1989 | Cheng et al. | 156/345.37 |
| 4,853,102 A | 8/1989 | Tateishi et al. | |
| 4,863,756 A | 9/1989 | Hartig et al. | |
| 4,874,497 A | 10/1989 | Matsuoka et al. | |
| 4,963,524 A | 10/1990 | Yamazaki | |
| 5,000,834 A | 3/1991 | Yoshikawa | |
| 5,099,790 A | 3/1992 | Kawakami | |
| 5,135,819 A | 8/1992 | Ito et al. | |
| 5,224,441 A | 7/1993 | Felts et al. | |
| 5,225,024 A | 7/1993 | Hanley et al. | |
| 5,328,583 A | 7/1994 | Kameyama et al. | |
| 5,364,665 A | 11/1994 | Felts et al. | |
| 5,437,725 A | 8/1995 | Schuster et al. | |
| 5,439,574 A | 8/1995 | Kobayashi et al. | |
| 5,527,394 A | 6/1996 | Heinrich et al. | |
| 5,627,435 A | 5/1997 | Jansen et al. | |
| 5,707,486 A * | 1/1998 | Collins | 156/345.49 |
| 5,717,294 A * | 2/1998 | Sakai et al. | 315/111.41 |
| 5,874,807 A | 2/1999 | Neger et al. | |
| 5,900,284 A | 5/1999 | Hu | |
| 5,945,008 A | 8/1999 | Kisakibaru et al. | |
| 6,066,826 A | 5/2000 | Yializis | |
| 6,077,403 A | 6/2000 | Kobayashi et al. | |
| 6,103,074 A | 8/2000 | Khominich | |
| 6,190,496 B1 | 2/2001 | DeOrnellas et al. | |
| 6,287,687 B1 | 9/2001 | Yializis et al. | |
| 6,819,053 B2 | 11/2004 | Johnson | |
| 6,911,779 B2 * | 6/2005 | Madocks | 315/111.21 |

OTHER PUBLICATIONS

Musil, et al., "Unbalanced magnetrons and new sputtering systems with enhanced plasma ionization", American Vacuum Society, Journal of Vacuum Science and Technology A 9 (3), May/Jun. 1991, pp. 1171-1177.

Decker, et al., "Surface Functionalization of Polymer Films and Webs Using Subatmospheric Plasmas", Society of Vacuum Coaters 41st Annual Technical Conference Proceedings, 1998, pp. 355-357.

Belkind, et al., "Magnetic biasing effects while using an unbalanced planar magnetron", American Vacuum Society, Journal of Vacuum Science and Technology A 11 (3), May/Jun. 1993, pp. 642-646.

* cited by examiner

MAGNETIC MIRROR PLASMA SOURCE AND METHOD USING SAME

FIELD OF THE INVENTION

Applicant's invention relates to a magnetic mirror plasma source.

BACKGROUND OF THE INVENTION

The related prior art is grouped into the following sections: magnetic confinement and the Penning cell source, facing target sputtering, plasma treatment with a web on a drum, and other prior art methods and apparatuses.

Magnetic Confinement and the Penning Cell Source

Confinement of electrons and ions using magnetic mirrors is presented in section 3.4.2 of J. Reece Roth, *Industrial Plasma Engineering, Volume 1: Principles*, IOP Publishing, Ltd. 1995.

Facing Target Sputtering

U.S. Pat. No. 4,963,524 to Yaniazaki teaches a method of producing superconducting material. An opposed target arrangement is used with the substrate positioned between the electrodes in the magnetic field. The magnetic field is symmetrical between the electrodes, and the substrate is in the middle of the gap. With the substrate in this position, the Hall current generated within the magnetic field tends to be distorted and broken. When this happens, the plasma is extinguished and/or the voltage is much higher.

Plasma Treatment With A Web On A Drum

In U.S. Pat. Nos. 5,224,441 and 5,364,665 to Felts et al., a flexible substrate is disposed around an electrified drum with magnetic field means opposite the drum behind grounded shielding. In this arrangement, the shield opposite the drum is either grounded or floating. The substrate is supported by the surface without a mirror magnetic field emanating from the substrate.

In U.S. Pat. No. 4,863,756 to Hartig et al., the substrate is continuously moved over a sputter magnetron surface with the surface facing the magnetron located inside the dark space region of the cathode. In this way, the magnetic field of the magnetron passes through the substrate and is closed over the substrate surface constricting the plasma onto the surface.

Other Prior Art Methods and Apparatuses

U.S. Pat. No. 5,627,435 to Jansen et al. discloses a hollow cathode source operating at high, diode plasma regime pressures (0.1-5 Torr). The plasma is created inside the hollow cathode holes and then is conducted to the substrate with the help of magnets under the substrate. Multiple individual magnets separated from each other are depicted.

U.S. Pat. No. 6,066,826 to Yializis discloses a plasma treatment source for web materials. The source magnet configuration is further defined in the referenced SVC Technical Conference paper (1998) by Decker and Yializis. A magnetron magnet array is positioned under a flexible web similar to Hartig et al. in U.S. Pat. No. 4,863,756. A hollow cathode electrode is positioned above the web.

U.S. Pat. No. 6,077,403 to Kobayashi et al. shows a magnetron in combination with a second magnetic field. In this patent, the second field passes through the substrate to a supplemental electrode. This apparatus is not a stand-alone plasma source—it assists with ionizing and directing sputtered material to the substrate. Also, the first embodiment has the mirror field with a stronger magnetic field at the supplemental electrode than at the surface of the substrate.

In U.S. Pat. No. 4,631,106 to Nakazato et al., magnets are located under a wafer to create a magnetron type field parallel to the wafer. The magnets are moved to even out the process. The opposed plate is grounded, and the wafer platen is electrified.

U.S. Pat. No. 4,761,219 to Sasaki et al. shows a magnetic field passing through a gap with the wafer on one electrode surface. In this case, the electrodes are opposed to each other. The wafer is placed on the less compressed magnetic mirror surface, and the opposed surface across from the wafer is grounded.

U.S. Pat. No. 4,853,102 to Tateishi et al. uses a cusp field to assist sputter deposition into high aspect ratio holes. The flux lines leaving the substrate do not enter a negatively biased electrode.

U.S. Pat. No. 5,099,790 to Kawakami shows a microwave source with a moving magnet below the wafer to even out the coating on the wafer. In another figure, the substrates are moved over a stationary magnet(s). In this source, the plasma is generated in a separate plasma generation chamber and then directed to the wafer substrate with the assistance of the magnet under the substrate.

In U.S. Pat. No. 5,225,024 to Hanley et al., ExB containment is achieved by forcing the B flux into a parallel path over the substrate surface. U.S. Pat. No. 5,437,725 to Schuster et al. discloses a metal web drawn over a drum containing magnets. The web is electrified, and the opposed shield is at ground potential.

The source disclosed in U.S. Pat. No. 5,900,284 to Hu produces several magnetron type confinement traps on the surface above the magnets.

SUMMARY OF THE INVENTION

Applicant's apparatus includes a plasma source apparatus comprising first and second surfaces with a gap between the surfaces, wherein the first surface comprises a substrate and wherein at least the second surface is connected to a power supply so as to contain electrons; a third surface connected to the power supply, a magnetic field passing through both the first and second surfaces and through the gap between the surfaces, wherein at least a portion of the magnetic field passing through the substrate is at least two times stronger at the substrate surface than at the second surface along that field line and is strong enough to magnetize electrons; and an electric field created by the power supply connected between the second surface and the third surface, wherein the electric field penetrates into an electron confining region of the magnetic field so that a created Hall electron current is contained within an endless loop.

BRIEF DESCRIPTION OF THE DRAWINGS

The invention will be better understood from a reading of the following detailed description taken in conjunction with the drawings in which like reference designators are used to designate like elements, and in which.

DETAILED DESCRIPTION OF THE PRESENTLY PREFERRED EMBODIMENTS

This invention is described in preferred embodiments in the following description with reference to the Figures, in which like numbers represent the same or similar elements.

International Application Number PCT/US02/11473, in the name of Madocks and assigned to the common assignee hereof, is hereby incorporated by reference. International Application Number PCT/US02/11541, in the name of Madocks and assigned to the common assignee hereof, is hereby incorporated by reference. International Application Number PCT/US02/11542, in the name of Madocks and assigned to the common assignee hereof, is hereby incorporated by reference.

In the prior art many magnetically confined plasmas are confined in two dimensions by the magnetic field and electrostatically in the third dimension. A planar magnetron, for instance, confines the electrons in the racetrack with arcing magnetic field lines and the electrostatic potential of the cathode target While the traditional magnetic confinement method is ideal for many applications, some are not best served with this arrangement. The embodiments of Applicant's invention described herein present a new apparatus and method to confine electrons to produce a low pressure, dense, relatively low voltage plasma. With these preferred embodiments, a combination of electrostatic and mirror magnetic confinement is implemented. The result is a novel plasma source that has unique and important advantages enabling advancements in sputtering, PECVD, etching, and plasma treatment processes.

Figure 1A:
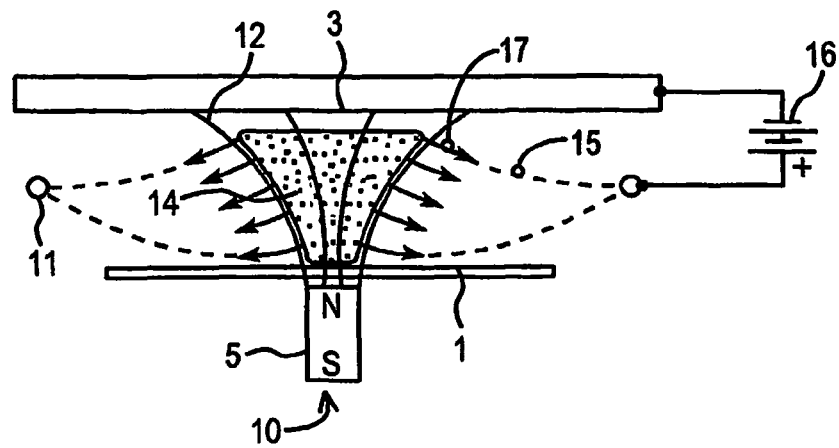
FIG. 1A shows a section view of a simple source of a preferred embodiment.

FIG. 1A shows a simple implementation of one preferred embodiment. Source 10 is located in a process chamber at a reduced pressure. A non-magnetic substrate 1 is placed over a magnet 5. A high permeability material such as steel serves as the cathode 3 and is positioned over substrate 1 at sufficient distance to allow a plasma to form between the cathode 3 and substrate 1. Anode 11 is a ring of wire positioned around the periphery of cathode 3. In this configuration, magnetic field lines 12 are formed between the magnet 5 and cathode 3. The field strength of these lines is stronger at the surface of the substrate 1 than at the cathode 3 forming a mirror magnetic field with the compressed end on the substrate 1. When a plasma voltage is impressed between cathode 3 and anode 11, a plasma 14 lights between the cathode 3 and substrate 1. In this embodiment, rather than the substrate 1 plasma facing surface 208 being held at cathode potential to reflect electrons, this surface 208 can be left electrically floating. An opposing surface 210 exists in substrate 1 and is shown parallel to surface 208. The electron containment is achieved by using the magnetic mirror effect The result is that electrons are contained in all degrees of freedom by either magnetic and electrostatic Lorentz forces or by the magnetic mirror formed over the substrate.

Figure 1B:
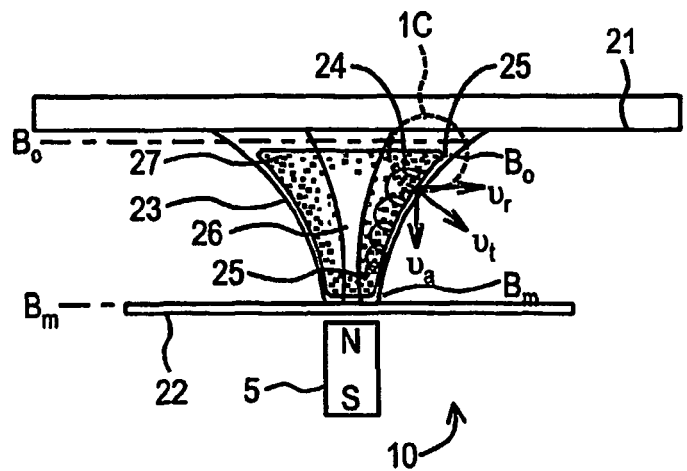
FIG. 1B shows a simplified view of electron movement within the mirror field.
Figure 1C:
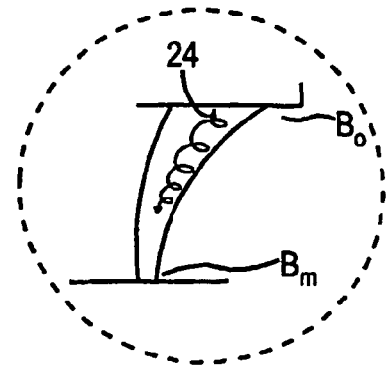
FIG. 1C is an enlargement of a portion of FIG. 1B.

Referring now to FIGS. 1B and 1C, an electron 24 emitted from cathode surface 21 is confined to travel along magnetic field line 25. As the electron 24 moves along field line 25 from a region of weaker magnetic field Bo toward a stronger magnetic field Bm, the electron's axial velocity Va is converted to radial gyration velocity Vr around the field line 25 and a longitudinal thermal velocity component Vt. If the axial velocity Va component Vt reaches 0 before the electron 24 has encountered substrate 22, the electron 24 is reflected back toward the weaker field region. As the ratio of strong to weak magnetic field increases, more electrons are reflected. This magnetic mirror effect is greatly assisted in the preferred embodiments by the electric field surrounding the magnetic field. This is depicted in FIG. 1A by arrows 17 and dashed line 15. This electric field imposes a radial force on electrons that encourages the radial velocity and results in better electron containment by the mirror effect. This can be seen in FIG. 1B as a cone of bright plasma 27 surrounding the inner plasma region 26.

This embodiment uses these characteristics to confine a low pressure plasma for the processing of a substrate. In source 10, a rare earth magnet 5 is used to create a strong magnetic field region at the plasma facing surface 208 of substrate 1. Further from the magnet, the field progressively weakens and spreads out to cathode plate 3. When a voltage ranging from ~400V-2000V or higher is impressed between the cathode 3 and anode 11 and the chamber pressure is approximately between 3 and 100 mTorr, electrical breakdown occurs, and a plasma is maintained in region 14. As electrons are created either by secondary emission from the cathode 3 or by collisions in the plasma, they are confined within plasma region 14 and generate an endless Hall current within plasma 14.

Figure 1D:
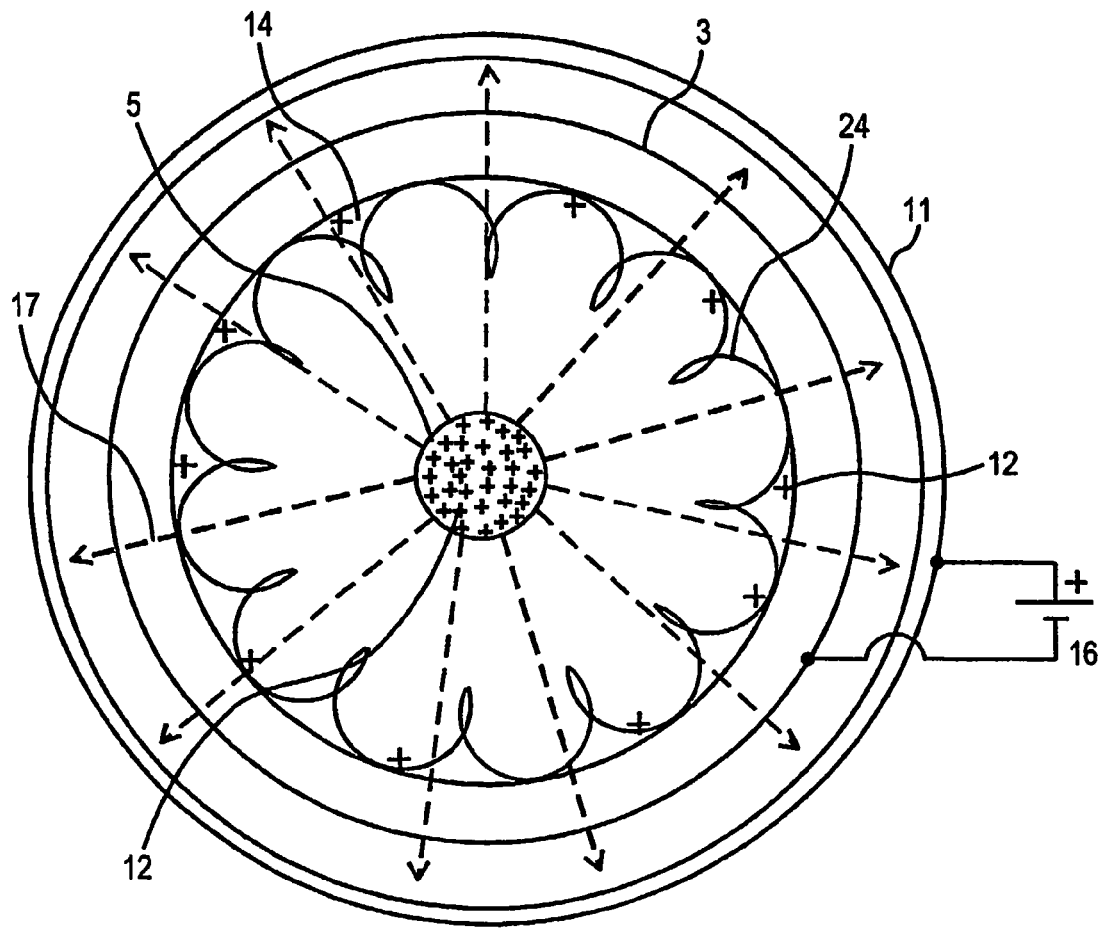
FIG. 1D shows a top view of the simple mirror source of FIG. 1A.

FIG. 1D shows a top view of source 10 with cathode plate 3 drawn transparent and substrate 1 removed for clarity. The magnetic field 12 in this view appears as crosses and dashed lines from magnet 5 to cathode 3. The dense cluster of crosses at magnet 5 indicates a stronger magnetic field. At the cathode 3 the magnetic field 12 is less dense. Anode 11 circumvents cathode 3. Power supply 16 is connected between cathode 3 and anode 11. With the power supply 16 on and process gas at a suitable pressure, plasma 14 lights in the gap between substrate 1 (not shown in this view) and cathode 3. This top view illustrates the closed drift nature of Applicant's source technology. As is well known in magnetron sputtering, the low impedance and uniform nature of the sputter magnetron are due to the endless Hall electron current loop created by the racetrack magnetic field over the cathode target The present invention also produces a closed drift electron containment Rather than by a racetrack shaped magnet array however, the closed loop electron container is created within a dipole magnetic field. An electron 24, after accelerating away from cathode 3 surface, attempts to follow electric field 17 to anode 11. Initially, near the cathode surface, the electric field 17 is parallel to the magnetic field 12 and the electron 24 is able to move away from the cathode 3. Further from cathode 3, the magnetic field 12 begins to compress toward magnet 5 while the electric field 17 diverges toward anode 11. As the electric field 17 diverges, the electron is prevented from following the electric field by the crossing magnetic field 12 and Lorentz forces induce a cycloidal motion to the electron. As is seen in FIG. 1D, the simple dipole magnetic field creates an endless containment loop as the cycloidal electron 24 motion returns upon itself. This fundamental advancement is important to the operation of the mirror source. The magnetic arrays of all the figures in this application produce this closed drift electron containment region.

Referring again to FIG. 1A, when the substrate is floated or connected to the electrode opposed to electrode 3, at least a portion of the magnetic mirror created between the plasma facing surface of substrate 1 and the plasma facing surface of cathode 3 must exceed a ratio of 2:1. This ratio is defined as the magnetic field strength at a point on the plasma facing surface of substrate 1 denoted at 202 at surface 208 versus the strength of that same field line as it enters the cathode 3 surface denoted at 204. A weaker ratio than 2:1 results in too few electrons being reflected by the magnetic mirror, and a low pressure plasma cannot be sustained.

This embodiment confines sufficient electrons such that a low pressure plasma is sustained In trials of many configurations, the ratio of at least 2:1 between the strong field over the substrate and the weaker field in the gap is important. As the ratio increases, the confinement improves. With rare earth magnets and substrates of thicknesses less than ½ inch, it is relatively easy to achieve ratios up to or exceeding 10:1. If the substrate is connected either in parallel to electrode 3 or to a separate power supply so that the substrate is biased to electrostatically confine electrons, the mirror field can be less than the 2:1 ratio.

The confinement obtained using this preferred embodiment is not as efficient as traditional electrostatic confinement. While with magnetic mirror ratios exceeding 2:1 and the anode placement accentuating the radial electron velocities produces confinement sufficient for a low pressure plasma, a substantial electron flow out of the plasma into the substrate is apparent.

For example, the pressure required to sustain the plasma is higher than a typical magnetron source. Where a magnetron source operates at 1-5 mTorr, the magnetic mirror source operates at pressures above 3 mTorr with typical pressures of 10 mTorr. In addition, the voltage of the mirror source is higher. A modified Penning discharge as shown in U.S. patent application Ser. No. 10/036,067, which is hereby incorporated by reference, can sustain a plasma at less than 400V. The mirror source low voltage operation is closer to 500V-1500V.

While the effect of reduced plasma confinement efficiency can be disadvantageous for some processes, it is beneficial to Applicant's invention. Looking at the configuration of FIG. 1A, sufficient electron containment is achieved to create a dense, Hall current contained plasma while the "poor" confinement results in a high electron flow out of the plasma directed at the substrate 1. This is an ideal arrangement for many plasma processes. In the dense plasma formed directly over the substrate etching compounds, PECVD reactants, or plasma treatment gases are efficiently activated. Simultaneously, the high electron and ion flow sweeps the activated particles onto the substrate. An analogy is the plasma, constrained by the cathode electrode and the mirror magnetic field, is like a pressurized bottle. At the substrate, the compressed mirror field forms the nozzle on the bottle, both restraining the flow and directing the flow out of the bottle.

Another aspect of this embodiment is that while the particle current to the substrate is high, the particle energy to the substrate is lower than sources energizing the plasma through the substrate. In this embodiment, the substrate is electrically floating. The floating potential of ~10V is low enough to largely rule out substrate or coating ablation or substrate damage due to impinging high energy particles. This is critically important to processes involving semiconductor wafers and low temperature substrate materials.

Note that the substrate can also be biased negatively with the same power supply 16 (DC in the case of a conductive substrate) or a different power supply. If the substrate is negatively biased, more electrons are repelled from the substrate and contained within the plasma. This can be useful to produce increased ion energies impinging the substrate. For non-conductive substrates, an AC, RF or pulsed DC power supply can be used. The advantage of floating the substrate is that thick, large, non-conductive substrates such as architectural glass or flexible polymer web can be used without the cost or complexity of a backside AC power supply. In particular, when an insulating substrate is too thick to pass even an RF signal, the preferred embodiment can be applied.

The substrate can also be grounded or connected as the anode in the FIG. 1A circuit The fundamental containment of the magnetic mirror continues to operate with the substrate as the anode. In this mode, the electron current to the substrate increases. While a sustained glow is maintained, the voltage is higher, a strong magnetic mirror is required, and/or the chamber pressure must be higher than when the substrate is floating or negatively biased. For some substrates, metal sheet for instance, a grounded substrate is much easier to configure. For others, plastic web or glass, the floating option is easier.

In any of these electrical configurations, the electron and ion flow onto the substrate is concentrated into the physical dimensions of the magnet pole as it emanates from the substrate. As the magnet pole is extended for wide substrates, the dense plasma region on the substrate takes the shape of a long bar. To obtain uniformity in the cross direction to the bar, the substrate must move in relation to the plasma. This is shown in later figures. The field lines 12 shown define the electron-confining region of the magnetic field.

Only the field lines that pass from the substrate to cathode 3 are shown. There are other field lines that do not pass through cathode 3, but these are not important. Electrons caught in these lines simply are collected at the substrate or swept to the power supply and are not contained long enough to help sustain a plasma.

The operating pressure for the preferred embodiments is below approximately 100 mTorr. Above this pressure the free mean electron path becomes considerably shorter than the magnetized electron Larmor radius and the effects of magnetic confinement are less visible. This comports with the classical definition of a magnetically confined plasma: A plasma is magnetically confined when the free mean electron path is greater than the Larmor electron gyro radius. References herein to a magnetic field strong enough to magnetize electrons means a magnetic field wherein the free mean electron path is greater than the Larmor electron gyro radius.

FIGS. 1A, 1B, 1C, and 1D, show a simple arrangement to explain the preferred embodiment Later figures depict several sources implementing the preferred embodiment to process wafers, flat substrates, and flexible substrates. While an attempt has been made to show the breadth of applications that can be addressed with the preferred embodiment, many more will be apparent to one skilled in the art. The preferred embodiment presents an entirely new genus of magnetically confined plasma source that will have as many species as the traditional magnetron/Penning confinement method.

Figure 2A:
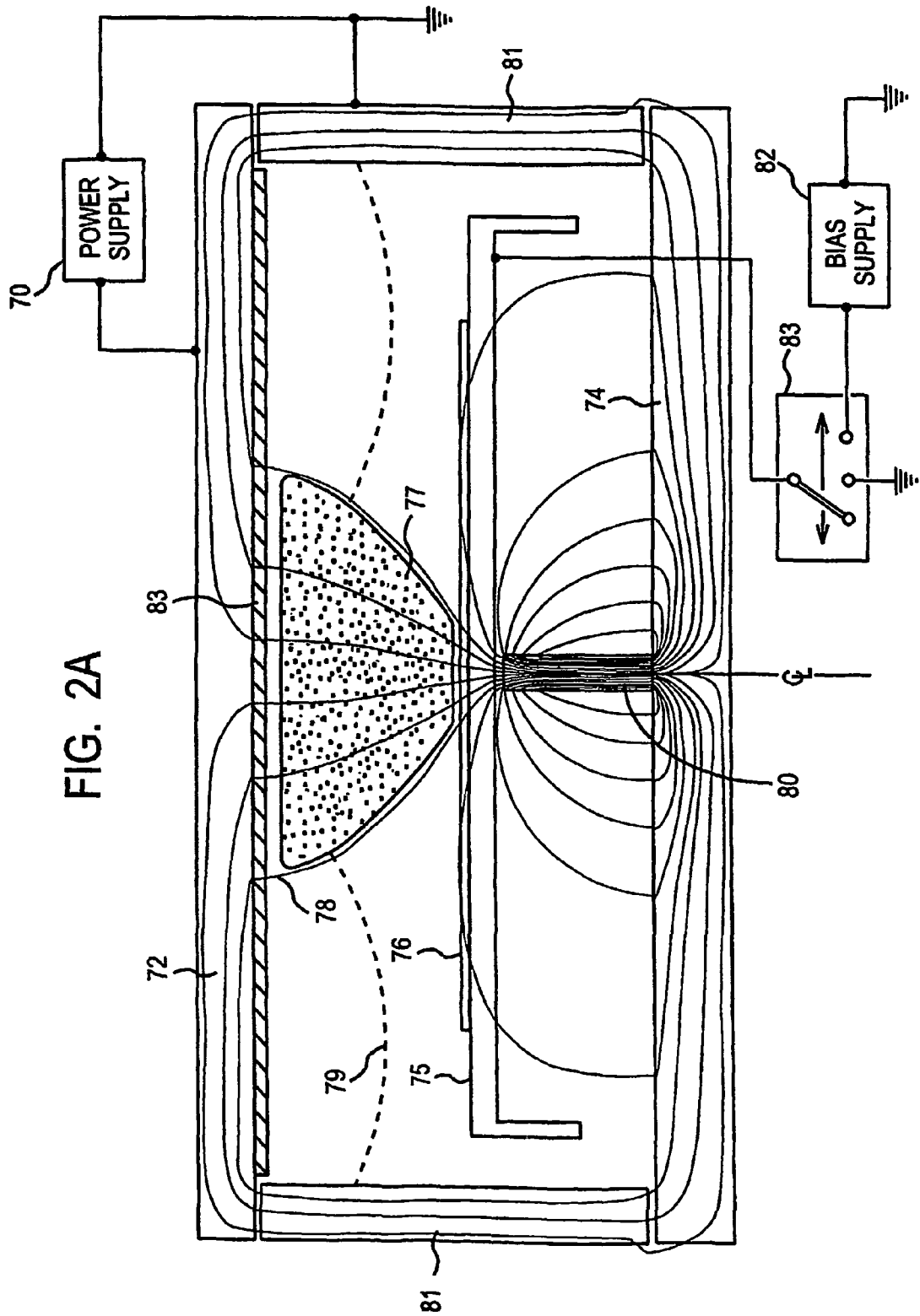
FIG. 2A shows a section view of a wafer ionized physical vapor deposition apparatus of a preferred embodiment

FIG. 2A shows an embodiment configured for ionized physical vapor deposition ("IPVD") onto round planar substrates such as silicon wafers. Wafer 76 is placed on non-magnetic stage 75. A magnetic field 78 is passed through the wafer, through the gap between the wafer and sputter target 83 to cover 72. Target 83 is bonded to cover 72 to improve thermal conductivity between target 83 and cover 72. Cover 72 is made of a high permeability material such as 400 series stainless steel and is water cooled. Wafer stage 75 is also water cooled. Water cooling of sputter sources is well known in the art and details are not shown. The magnetic field 78 in the gap between the substrate 76 and target 83 is generated by magnet array 80 and is assisted by high permeability members cover 72, steel shunt circle 81, shunt 74. Shunt 74 and magnet array 80 rotate under the stationary platen 75 to obtain a uniform coating on substrate 76. Power supply 70 is connected between cover 72 and shunt 81 to create an electric field 79. This can be a DC, pulsed DC, AC or RF power supply.

As explained in FIG. 1A, by producing a strong magnetic mirror field over the wafer substrate 76, a plasma 77 is confined within the magnetic field in the gap between target 83 and substrate 76. This plasma is of relatively low impedance compared to diode plasmas and the plasma density is high due to the endless, closed drift confinement of electrons within the dipole mirror field region. As previously discussed, due to the magnetic mirror electron confinement at the wafer 76 surface, stage 75 and wafer 76 can be electrically floated or separately biased with bias power supply 82. Switch 83 is included in the electrical circuit to illustrate these options. In the case of IPVD, a 50-460 kHz AC power supply is often used for bias supply 82. Current at this frequency readily passes through a silicon wafer and, with the appropriate blocking capacitor, allows a controllable, negative DC bias to be applied to the wafer 76 surface. This bias voltage is then set to produce the ion bombardment energy desired.

Figure 2B:
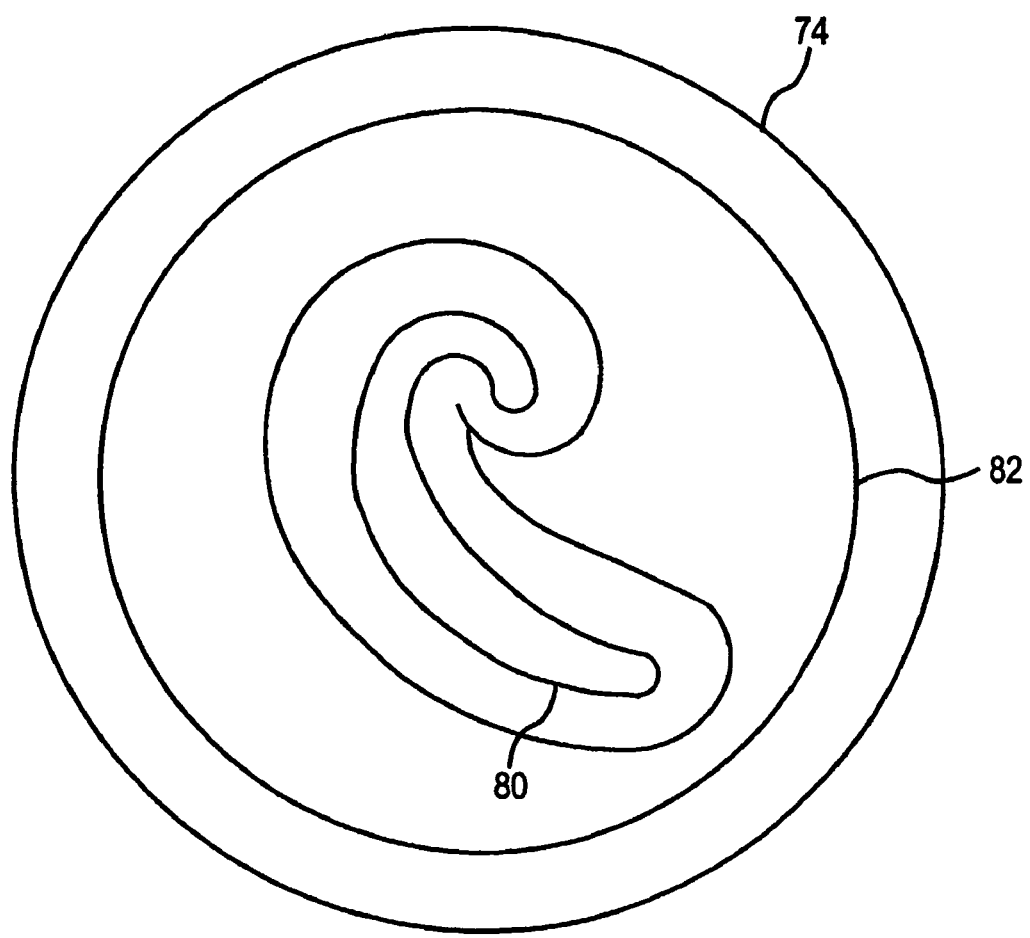
FIG. 2B shows a top view of the apparatus of FIG. 2A with the top cathode plate made transparent for clarity.

FIG. 2B shows a top view of the FIG. 2A source with the top cover 72 and target 83 removed. This view shows one embodiment of magnet array 80 to produce a uniform coating on the wafer surface. This 'comma' magnet pattern is designed so that by rotating stage 75 about its central axis, the deposition on the wafer is uniform.

Figure 2C:
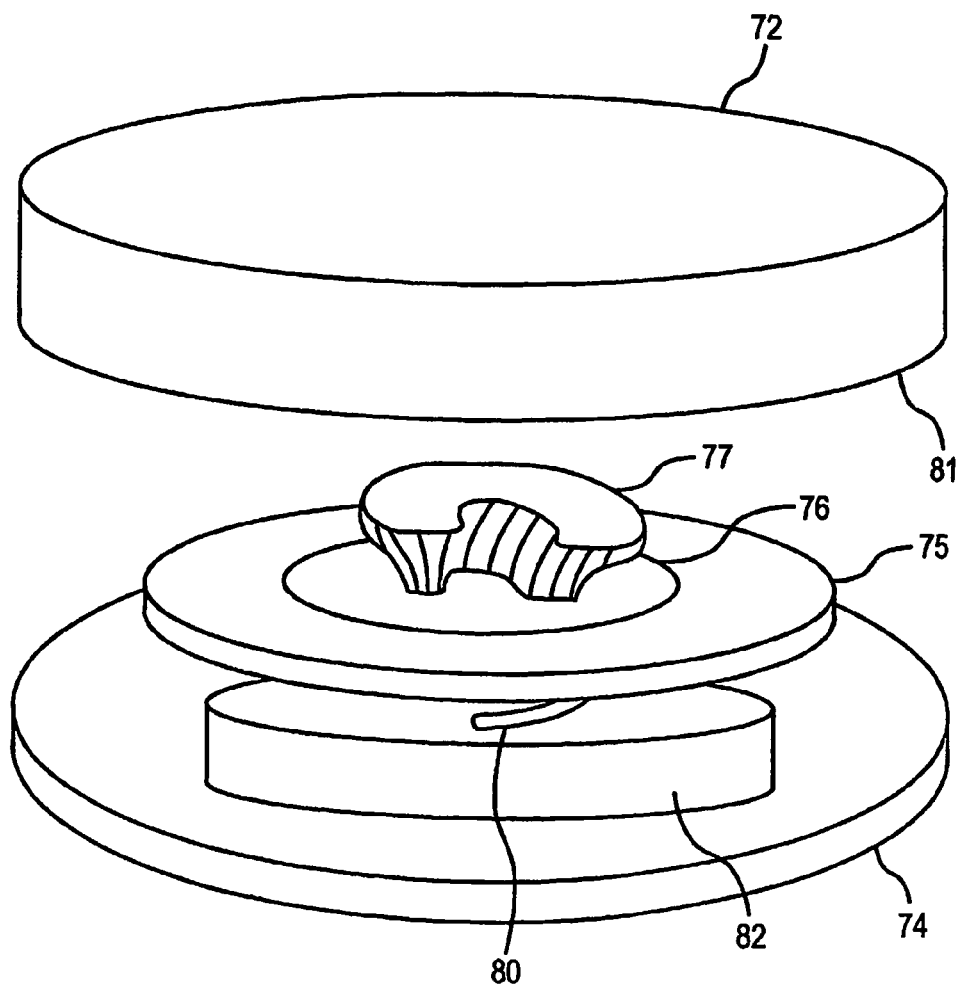
FIG. 2C shows an isometric view of the wafer sputtering apparatus of FIG. 2A.

FIG. 2C shows an exploded isometric view of the IPVD source. In FIG. 2C, the wafer substrate 76 is centered on stage 75. Magnet array 80 rotates under the stage 75 resulting in confined plasma 77 rotating over wafer 76. While the 'comma' type magnet array design of FIG. 2B is useful to produce uniform sputtered coatings on wafer 76, many other magnetic configurations can be implemented to achieve uniform deposition while maintaining the basic inventive method of mirror confinement Other magnet array embodiments include a linear magnet array scanned under a rectangular shaped stage. A curved magnet array similar to the 'comma' shaped field shown in FIG. 2B can be translated as well as rotated to improve uniformity at the center point on the wafer.

In the FIGS. 2A, 2B and 2C source, the magnet material is a rare earth type. The field 78 produced between the wafer and electrode 72 is greater than 100 gauss—in other words, the plasma electrons are "magnetized" in the gap. Using today's materials, it is relatively easy to increase the magnetic field strength to also magnetize the plasma ions. This requires a magnetic field strength nearing or greater than 1000 G. The plasma of the method of the preferred embodiment adapts well to ion magnetization because there are no cathode surfaces to interrupt a larger gyro radius as with a planar magnetron type confinement.

Where prior art sources have used magnets under the wafer to direct plasma down onto the wafer from another plasma source, Applicant's method produces a dense plasma in and of itself, the dense plasma forming directly over the wafer surface. The benefits of focusing the electron and ion flow down on the wafer are fully realized using Applicant's method. As shown by switch 83 and bias power supply 82, the inventive method allows for platen 75 and wafer 76 being either left floating, grounded or positively or negatively biased by supply 82.

The present invention has advantages for sputtering and IPVD processes. As described earlier, the impedance of the magnetic mirror source is higher than a magnetron cathode sputter source. One aspect of higher impedance is a higher operating voltage. For sputtering this can be an advantage because sputter yield rates rise significantly as voltage increases. Therefore, the sputter rate with the mirror source is higher in this regard.

The electron confinement of the present invention produces a dense plasma cloud between the sputter target and substrate. By operating the mirror source at higher pressures, for instance, 30 mTorr, a large number of neutral metal flux atoms ejected at the target are ionized before reaching the substrate. Significant ionization is apparent when, while sputtering copper in argon, the plasma in the magnetically confined region is bright green in color.

Magnetic materials can be sputtered as easily as non-magnetic materials. This is a major benefit of the present invention as applied to sputtering processes.

The target utilization is improved over magnetron sputtering. As is well known with magnetron sputtering, a deep racetrack groove forms as the target is eroded. This self-perpetuating effect results in poor usage of expensive sputter materials. The mirror source on the other hand tends to erode the target relatively evenly over the entire sputtered region. Not only is target utilization improved but the net sputter rate on the substrate does not vary over time.

Figure 3A:
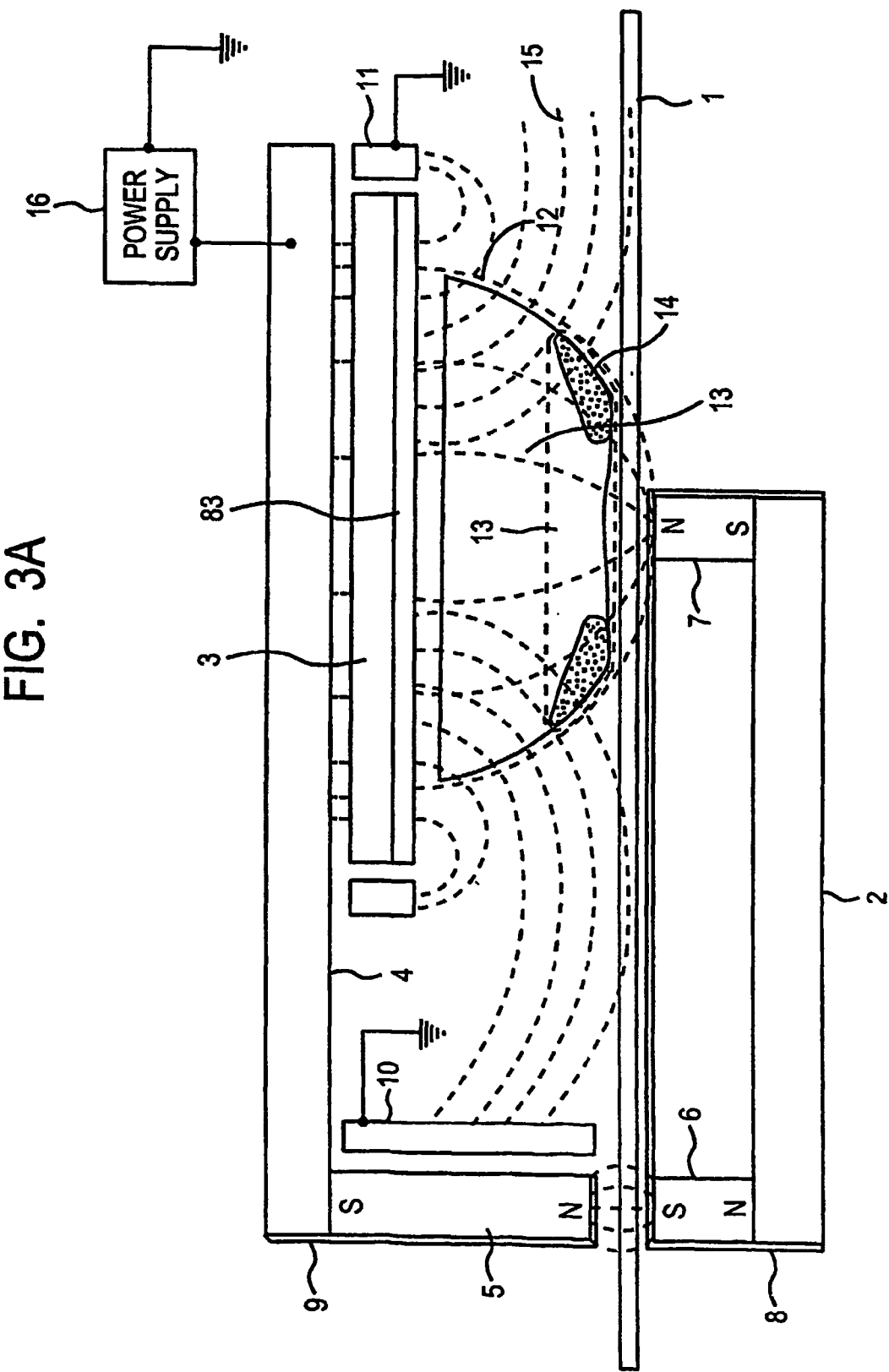
FIG. 3A shows a section view of a planar substrate sputter deposition apparatus.

FIG. 3A is a section view of a sputter source comprising an embodiment for use with large planar substrates. In this case substrate 1 may be a rigid planar substrate or a web tensioned to be planar between two continuously moving rolls. Substrate 1 is in proximity to shield 8 but is far enough away to allow the substrate 1 to be conveyed without scrapping shield 8. A magnetic field 12 is set up between the substrate and sputter target 83 by permanent magnets 5, 6, and 7, magnetic shunts 2 and 4 and cathode shunt 3. The field 12 is shaped into a "shower head" mirror field with the substrate 1 located at the compressed end.

An electric field 15 is created by power supply 16 between cathode target 83 and the chamber ground. Shields 9, 10 and 11 are connected to ground. Magnet shunt 4 and shield 8 electrically float Power supply 16 can be DC even in the case of a dielectric substrate because there is no current flow to shield 8. Alternatively, in the case where a dielectric coating is being sputtered, a pulsed DC or AC power supply 16 can be used.

The plasma 13 is confined by the magnetic field 12, cathode target 83, and the magnetic mirror at the substrate 1. The electrons are trapped in the dimension out of or into the paper by electric field lines 15 that continuously circumvent the magnetic field 12 all around magnetic field 12. The result is that Hall current 14 created by the electron confinement is trapped into a continuous loop within the magnetic field 12. At low powers, this containment ring is readily apparent to the eye. At higher powers, the plasma expands to fill the region 13 between the substrate and target 83.

Note that the anode is the chamber wall and grounded shields. This provides sufficient electric field penetration into the gap between cathode target 83 and substrate 1 for the plasma confinement effects. The gap between cathode 83 and the substrate 1 must be sufficient to strike a plasma. The gap size is also based upon the necessity to create a strong mirror magnetic field between surfaces 83 and 1, the need for a magnetic field sufficient to magnetize at least electrons, and to enable observation of the plasma from a view port. A typical gap is about 2 inches.

A source like that in FIG. 3A was built with a 4" long ceramic magnet 7 (out of the paper) and an 8" long cathode shunt 3 with a similar sized sputter target 83 bonded to shunt 3. With the chamber pressure at 20 mTorr and a voltage of approximately 800V impressed between cathode 83 and ground, a bright plasma is maintained over substrate 1 as shown. To start the discharge, the pressure may have to be spiked depending upon the ignition voltage of the power supply. While specific values are given here, different pressures, voltages, frequencies and power levels can be used depending upon the process gas, substrate thickness and material, magnetic fields and other variables. The values given are intended to provide the engineer with starting values to demonstrate the preferred embodiment. As with traditional magnetron confinement, the operating values can vary widely while still receiving the benefits of the preferred embodiment.

Figure 3B:
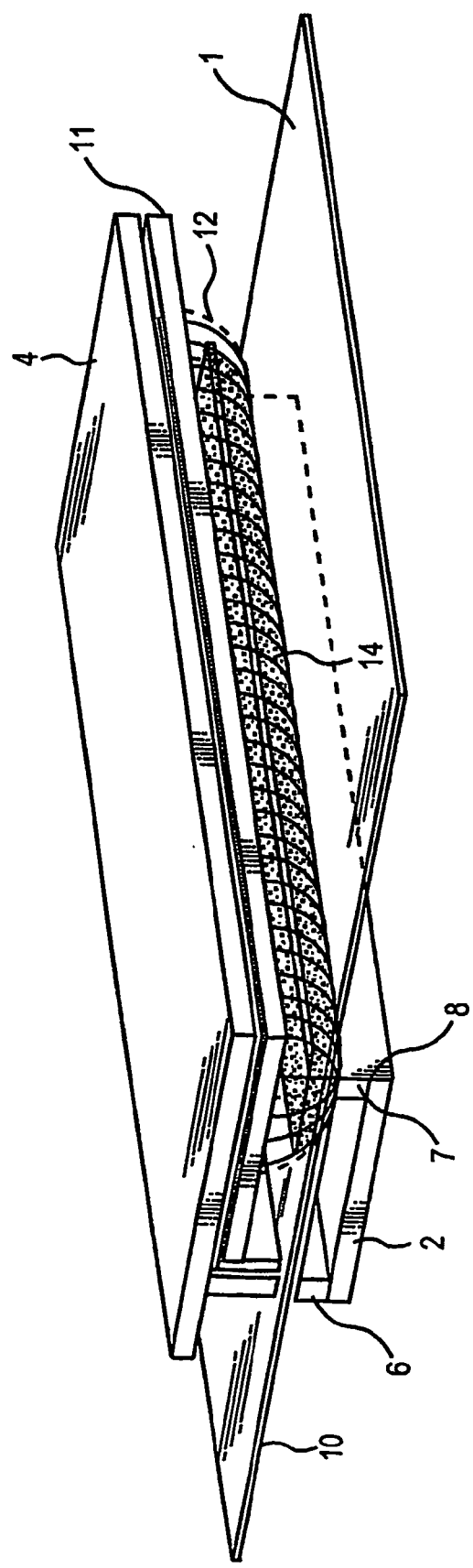
FIG. 3B shows an isometric view of the apparatus of FIG. 3A.

FIG. 3B is an isometric view of an extended FIG. 3A plasma source. In this view, one can see that the plasma Hall current is contained within the dipole magnetic field bounded by substrate 1 and sputter target 83. The magnetic field is generated by magnets 5, 6, and 7 and is assisted by high permeability shunts 2, 3 and 4. Note that with this dipole arrangement, magnet pole 7 simply ends near the edge of the substrate. The magnetic field 12 in the gap extends from permanent magnet 7 to cathode 83 to create one extended showerhead mirror magnetic field. Within this field, Hall currents are confined into an endless loop creating intense plasma 13. Substrate 1 is conveyed over magnet poles 6 and 7 and shield 8. The gap between shields 8 and 9 is small to minimize spurious plasma generation while allowing the substrate to pass through unobstructed. Shield 10 and 11 may receive enough heat to require water cooling. This is largely dependent upon the type of process, power levels, materials and factors relating to the configuration of the plasma contacting surfaces, fields, etc.

For most industrial processes with long process runs and high powers, all electrodes must be water cooled using known techniques. Note that the FIG. 3B source is depicted longer than the 4 inch long ceramic magnet described. The source is shown longer to illustrate the ability of the present invention to be extended to large area substrates. To scale the FIG. 3B view, the gap between the substrate 1 and shield 11 (the sputter target 83 can not be seen in this view) is about 2 inches.

Figure 4:
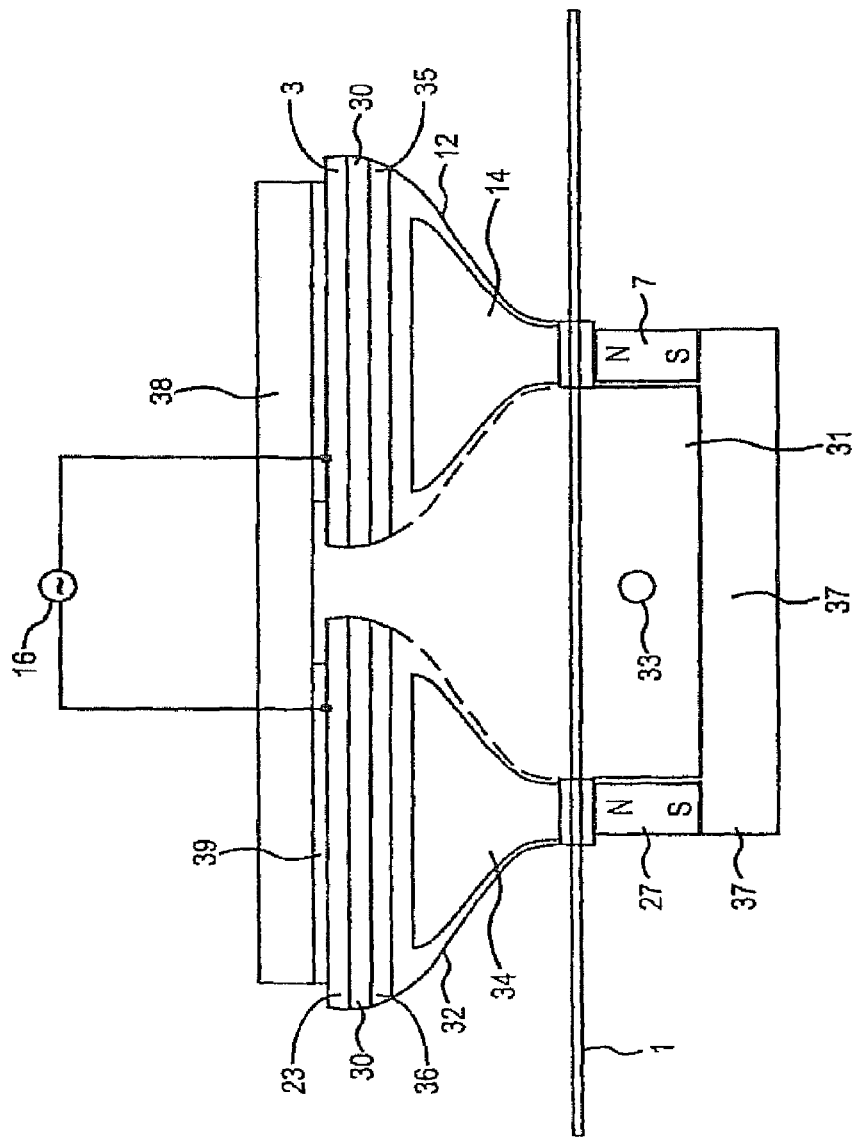
FIG. 4 shows a section view of a dual source of a preferred embodiment.

FIG. 4 shows a section view of another planar source embodiment. In this source two magnetic mirror regions 14 and 34 are created within one magnetic field circuit. Two sputter cathodes 35 and 36 are connected across a mid-frequency (50-450 kHz) power supply 16 similar to a dual magnetron configuration known in the art. Like the dual magnetron configuration, reactive, insulating coatings can be sputtered because each source alternates as both an anode and cathode. In the cathode mode, ion impingement tends to ablate and clean the electrode so that anode conductivity is maintained over extended production runs.

The magnetic circuit consists of high permeability shunt 37, magnet 27, mirror plasma gap 34, shunt 23, shunt 38, shunt 3, mirror plasma gap 14 and magnet 7. Substrate 1 is conveyed over water cooled non-magnetic block 31 without touching block 31 by conveyor rolls not shown. Block 31 is water cooled by drilled hole 33 and water piping not shown. Sputter targets 35 and 36 are bonded to water cooled backing plates 30. Water cooling of sputter targets is well known and details are not shown. Backing plates 30 are fastened to high permeability shunts 3 and 23.

While many configurations are possible to produce the magnetic mirror effect of the present invention, the use of a high permeability shunt plates 3 and 23 at the expanded end of the magnetic mirror works well to collect the magnetic flux lines 12 and 32 coming out of magnets 7 and 27 respectively and produce the champagne glass looking magnetic mirror fields 12 and 32 shown. When power supply 16 is turned on and process gas maintains the process chamber at ~5-100 mTorr, plasmas 14 and 34 light. Power supply 16 may be set to a wide range of frequencies. Readily available AC sputter power supplies have frequency ranges from 20 kHz to 460 kHz. This frequency range works well for sputtering as well as PECVD or reactive ion etching processes. RF frequencies, for instance 13.56 MHz, can also be used.

The source of FIG. 4 can be extended to any width required in the same way a magnetron sputter cathode can be extended. In this case, the dual gap magnet arrangement is lengthened under the substrate and the parallel sputter cathode arrangement over the substrate is equally extended. As with a magnetron cathode, the confined Hall current moving around the "racetrack" provides an inherent uniformity across the length of the source. By moving the substrate orthogonal to the extended plasma regions 14 and 34, a uniform sputter coating of the substrate 1 is obtained.

Figure 5:
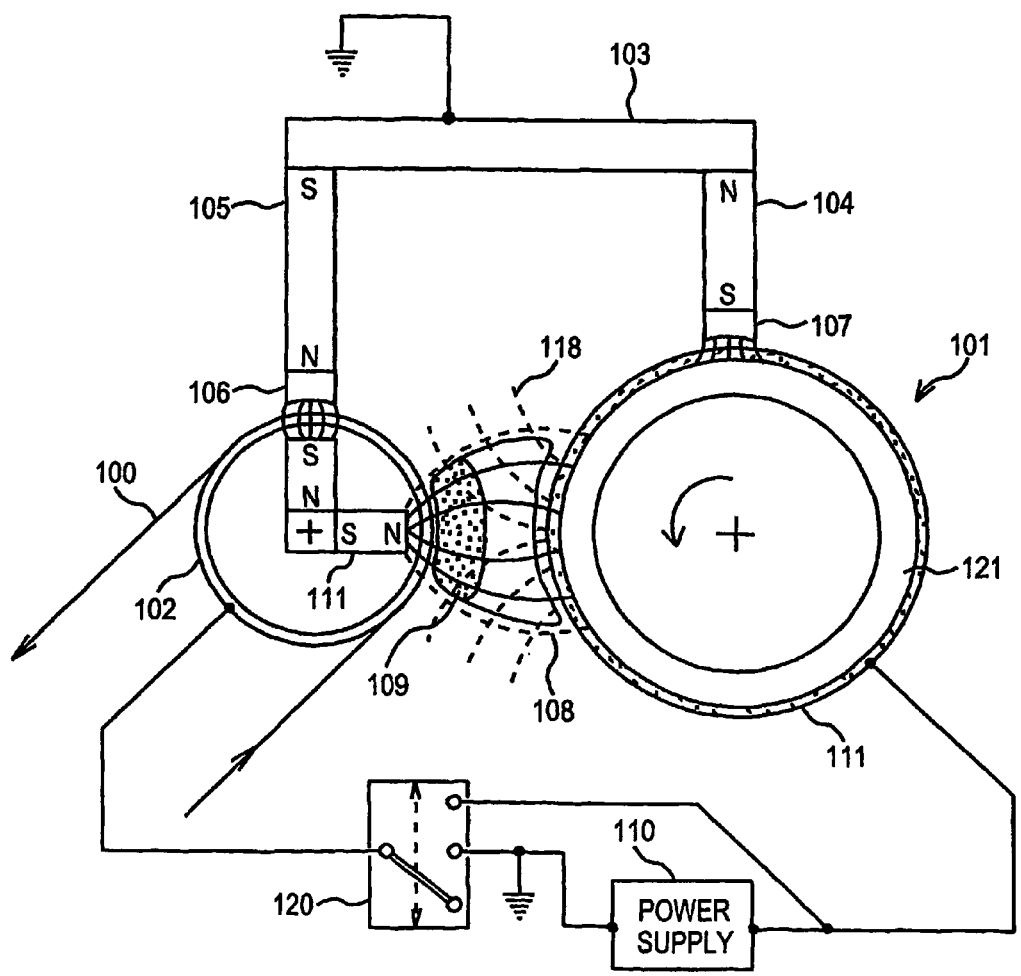
FIG. 5 shows a section view of an apparatus for sputter deposition on a flexible web substrate.

FIG. 5 shows a section view of a web coating apparatus embodiment. In this embodiment, web 100 is moved continuously over rolling support 102. Roll 102 contains permanent magnet and magnet shunt assembly 111. Roll 101 has an inner steel roller 121 of sufficient thickness to carry magnetic field 108 and is covered by material to be sputtered 111. Roll 101 is rotated to increase the time between target changes and to assist with target cooling. Cooling water is circulated through both the cathode inner steel roller, 121 and web supporting roller 102.

Rotating sputter targets are well known in the art. Magnetic field 108 is created in the gap between rolls 101 and 102 by magnetic assembly 111, steel roll 101, magnet shunt pieces 106 and 107, permanent magnets 104 and 105 and magnetic shunt 103. Due to the different pole structures, magnetic field 108 is not a symmetrical mirror field but takes on the appearance of a showerhead. Roll 101 is connected to power supply 110 as the cathode electrode and roll 102 can either be left electrically floating, connected as an anode in the electrical circuit 120, or connected in parallel with roll 101 as the cathode.

Different outcomes result and offer different advantages depending upon process requirements. When roll 102 is left floating, an electron trap is maintained by the magnetic mirror effect as electrons approach the compressed magnetic field 108 at the roll 102 surface and by the physical presence of web 100 on roll 102. The magnetic field 108 is surrounded by electric field 118 so that Hall currents are contained within magnetic field 108, and an intense plasma 109 is created. In this embodiment, magnetic pole pieces 106 and 107 are electrically floating, permanent magnets are ceramic type and are not electrically conductive, and magnetic shunt 103 is connected to the chamber ground.

Roll 101 must be connected as a cathode. Roll 102, with the stronger magnetic field, can be connected as the anode, cathode or floating. Power supply 110 can be DC, pulsed DC, mid frequency AC or RF. In the case of metal conducting sputtering applications, a DC power supply works well. The source of FIG. 5 shows the present invention implemented with a rotating sputter target. Many combinations and variations are possible within the scope of the present invention. For example, dual rotating targets can be implemented with the source configuration shown in FIG. 4.

Figure 6:
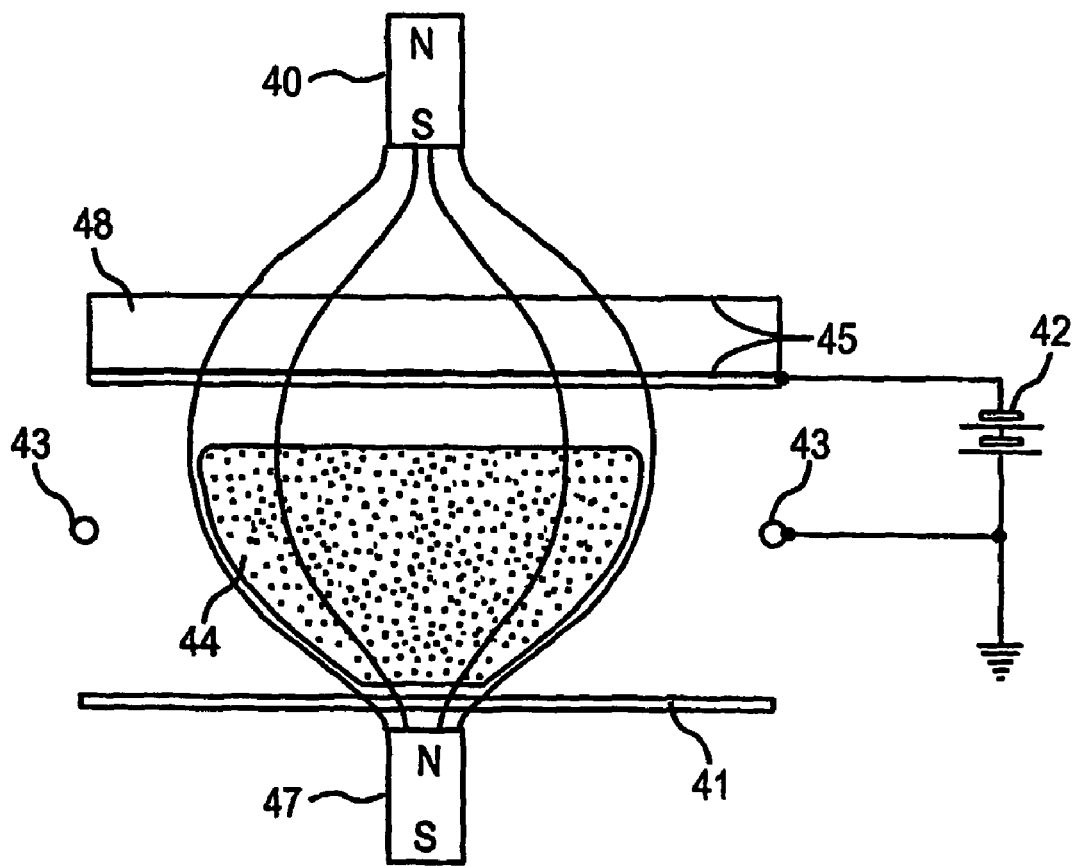
FIG. 6 shows a section view of another preferred embodiment

FIG. 6 depicts another sputter source embodiment. In this source, two magnets are disposed across a gap. Sputter cathode electrode 45 is located approximately in the center of the gap. Electrode 45 is constructed of copper, stainless steel, titanium or other non-magnetic material to be sputtered. As can be seen, a mirror magnetic field is generated with the compressed field passing through the substrate 41 and the less compressed field passing through the cathode electrode 45. When voltage from a power supply 42 is impressed across the cathode electrode 45 and a ring anode 43 such that electric fields penetrate into the magnetic field sufficiently, the electron Hall current is contained within the magnetic field. With sufficient voltage and process gas pressure, a plasma 44 is formed between the cathode and substrate. FIG. 6 illustrates that magnetic arrangements other than a high permeability cathode can be implemented. In this source, target 45 is bonded to water cooled backing plate 48.

All the embodiments of the invention include a high permeability member or permanent magnet at the uncompressed, cathode electrode end of the magnetic field. This configuration pulls the magnetic field from the magnet under the substrate, through the gap and into the cathode electrode. An alternative is to position only a non-magnetic electrode over the substrate. For instance, in FIG. 6 magnet 40 could be removed. The magnetic field would primarily loop around from the north pole to south pole of magnet 47. A small portion of the field would pass from the north pole of magnet 47 and, before arriving at the south pole, pass through cathode surface 45. If this field is strong enough to magnetize electrons, a plasma per the inventive method will form. Again, because of the relative simplicity of using a magnetic material in the cathode 45 'assembly' and the benefit of increasing the field lines into the cathode, a magnetic material is preferred.

In certain embodiments, cathode surface 45 is moved closer to magnet 40. In this configuration, the electrons moving toward the substrate are moving from a region of weak magnetic field to a stronger field (with a ratio in excess of 1:2).

The combined Lorentz and magnetic mirror electron confinement arrangement trap the Hall current in a racetrack orbit directly over the substrate. Of similar magnitude to Penning's work in the 1930's, this confinement regime opens doors to a wide range of processes and technologies producing results not resembling known prior art Many applications for sputtering, PECVD, plasma etching and plasma treatment will be substantially improved or made possible. Also, the new source can be combined with other plasma sources to improve upon or create new plasma sources. While many benefits to this new technology will be found, some of the benefits include:

For sputtering applications, the confinement of electrons in the gap between the sputter target and substrate increases the degree of ionization of the sputtered flux. This can be useful for many applications.

Magnetic materials can be sputtered as readily as non-magnetic materials. In sputter magnetrons, magnetic materials are difficult to sputter because the target must be saturated before the electron confining racetrack magnetic field permeates through the target. In the present invention, the orthogonal positioning of the magnetic field obviates this problem.

The magnetic and electric field confinement geometry produces a symmetrical, endless racetrack confinement zone similar to a planar magnetron sputtering device or a grid-less ion source. As is known in these technologies, the length of the confinement zone can be extended to accommodate wide substrates while maintaining a uniform plasma. This is a major improvement over unconfined RF or microwave discharges for large substrates at significantly less cost.

As a true magnetically enhanced plasma source, the efficient plasma confinement allows operation at low pressures and voltages. Many process advantages are gained by this. Plasma does not light in other parts of the chamber or on electrode surfaces outside of the containment zone. The plasma is characteristically stable and uniform. Lower plasma voltage requirements make the power supplies safer and less costly.

The technology is adaptable to different process substrate energy requirements. As shown in the figures, the substrate can be floating, biased negatively, or biased positively to produce different results.

Finally, it should be noted that any of the alternatives discussed above can be used alone or in combination with one another. Some of these alternatives include:

The surface of the cathode electrode can be planar, curved, a rotating roll, beveled or a variety of other shapes.

The substrate can be biased positively, tied to ground, left floating, or biased negatively.

AC or RF voltage can be used to bias the substrate. If the substrate is electrically conductive, DC can be used to bias the substrate.

DC, AC, or RF can be used to power the cathode electrode depending upon the application.

The magnetic field can be moved relative to the substrate instead of the substrate moving relative to the magnetic field.

The magnetic field can be made with high permeability materials and magnets both above and below the substrate or just below the substrate.

While the preferred embodiments of the present invention have been illustrate in detail, it should be apparent that modifications and adaptations to those embodiments may occur to one skilled in the art without departing from the scope of the present invention as set forth in the following claims.

I claim:

1. A plasma source apparatus comprising:
    a substrate having a first surface and an opposing surface;
    a second surface, said second surface being spaced apart from said first surface by a predetermined gap, connected to a power supply as a cathode;
    a third surface connected to the power supply as an anode;
    a magnetic field source comprising a permanent magnetic oriented with a north pole proximal to said substrate relative to a south pole and providing a magnetic field axial with said magnetic field source, said magnetic field passing into both said first and second surfaces and through said gap, said magnetic field having a portion passing through said substrate that is at least two times stronger at said first surface than at said second surface, said magnetic field portion having a strength strong enough to magnetize electrons; and
    an electric field extending to said second surface and said electric field penetrating into an electron confining region of said magnetic field to confine the electrons electrostatically and with mirror magnetic confinement.

2. A plasma source apparatus in accordance with claim 1, wherein:
    said electric field extends to said substrate.

3. A plasma source apparatus in accordance with claim 1, comprising:

a chamber, said chamber containing said first and second surfaces; and said electric field extends from said chamber to said substrate.

4. A plasma source apparatus in accordance with claim 1, comprising:

said substrate moving continuously relative to said magnetic field.

5. A plasma source apparatus in accordance with claim 1, wherein:

said substrate has said first surface parallel to said opposing surface.

6. A plasma source apparatus in accordance with claim 1, wherein:

said substrate is biased positively.

7. A plasma source apparatus in accordance with claim 1, wherein:

said substrate is tied to ground.

8. A plasma source apparatus in accordance with claim 1, wherein:

said substrate is left floating.

9. A plasma source apparatus in accordance with claim 1, wherein:

said substrate is biased negatively.

10. A plasma source apparatus in accordance with claim 1, wherein:

said substrate is biased with an AC voltage.

11. A plasma source apparatus in accordance with claim 1, wherein:

said first and second surfaces are parallel.

12. A plasma source apparatus in accordance with claim 1, wherein:

said first and second surfaces are non-parallel.

13. A plasma source apparatus in accordance with claim 1, wherein:

said substrate comprises a flexible web supported by a conveyor roll.

14. A plasma source apparatus in accordance with claim 1, comprising:

a mirror field shaped into a racetrack and having a return field passing through the center of the racetrack.

15. A plasma source apparatus comprising:

a substrate having a first surface and an opposing surface;

a second surface, said second surface being spaced apart from said first surface by a predetermined gap, connected to a power supply as a cathode;

a third surface connected to the power supply as an anode;

a permanent magnet oriented with a north pole proximal to said substrate relative to a south pole and under said substrate providing a magnetic field axial with said permanent magnet under said substrate, said magnetic field passing into both said first and second surfaces and through said gap, said magnetic field having a portion passing through said substrate that is at least two times stronger at said first surface than at said second surface, said magnetic field portion having a strength strong enough to magnetize electrons; and an electric field extending to said second surface and said electric field penetrating into an electron confining region of said magnetic field to confine the electrons electrostatically and with mirror magnetic confinement.

16. A plasma source apparatus in accordance with claim 15, wherein:

said electric field extends to said substrate.

17. A plasma source apparatus in accordance with claim 15, comprising:

a chamber, said chamber containing said first and second surfaces; and said electric field extends from said chamber to said substrate.

18. A plasma source apparatus in accordance with claim 15, comprising:

relative movement between said substrate moving continuously relative to said magnetic field.

19. A plasma source apparatus in accordance with claim 15, wherein:

said substrate is biased negatively.

20. A plasma source apparatus in accordance with claim 15, wherein:

said substrate is biased with an AC voltage.

21. A plasma source apparatus in accordance with claim 15, wherein:

said first and second surfaces are parallel.

22. A plasma source apparatus in accordance with claim 15, wherein:

said substrate comprises a flexible web supported by a conveyor roll.

23. A plasma source apparatus in accordance with claim 15, comprising:

a mirror field shaped into a racetrack and having a return field passing through the center of the racetrack.

\* \* \* \* \*